United States Patent [15] 3,665,331
Wiarda et al. [45] May 23, 1972

[54] DEVICE COMPRISING A TRANSISTOR AMPLIFIER HAVING AN INPUT AMPLIFYING STAGE AND AN OUTPUT AMPLIFYING STAGE

[72] Inventors: Robartus Pieter Wiarda; Willem Van Dorn, both of Hilversum, Netherlands

[73] Assignee: U.S. Philips Corporation, New York, N.Y.

[22] Filed: Apr. 3, 1970

[21] Appl. No.: 22,143

Related U.S. Application Data

[63] Continuation of Ser. No. 770,189, Oct. 24, 1968.

[30] Foreign Application Priority Data

Nov. 6, 1967 Netherlands..........................6715086

[52] U.S. Cl.....................................330/28, 330/29, 330/88, 330/102

[51] Int. Cl.........................................................H03f 1/34

[58] Field of Search...........................330/28, 29, 88, 89, 102

[56] References Cited

UNITED STATES PATENTS 3,134,080 5/1964 Story.....................................330/102

*Primary Examiner*—Roy Lake
*Assistant Examiner*—James B. Mullins
*Attorney*—Frank R. Trifari

[57] ABSTRACT

The invention relates to a device comprising a transistor amplifier having an input amplifying stage an output amplifying stage and an output circuit including an output transformer transistor amplifier has a combined voltage and current negative feedback. The output circuit of the output amplifying stage is coupled with the emitter circuit of the input amplifying stage through a coupling network in which the voltage of the output circuit is applied through a voltage coupling circuit for the negative voltage feedback and the voltage proportional to the current through the output circuit across a series resistor in series with the output transformer is applied through a current coupling circuit for the negative current feedback to the emitter circuit. The negative current feedback circuit includes furthermore an adjustable control-resistor for controlling the amplification factor of the transistor amplifier.

2 Claims, 1 Drawing Figure

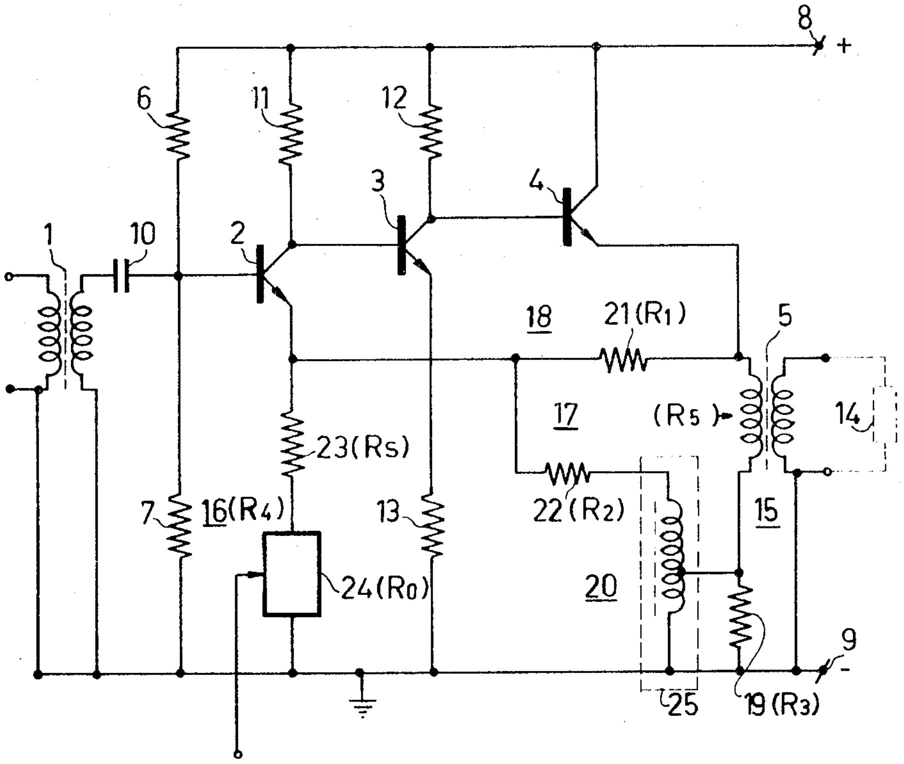
INVENTORS
ROBARTUS P. WIARDA
WILLEM VAN DOORN
BY
AGENT

DEVICE COMPRISING A TRANSISTOR AMPLIFIER HAVING AN INPUT AMPLIFYING STAGE AND AN OUTPUT AMPLIFYING STAGE

This is a continuation of application Ser. No. 770,189, filed Oct. 24, 1968.

Such devices are particularly used as amplifying repeaters in carrier frequency transmission systems in which from a central station the amplification factor of the transistor amplifier is adjusted for level-control purposes by controlling the resistance value of the control-resistor in the emitter circuit with the aid of a pilot signal. The control-resistor may be formed by an incandescent lamp or a thermistor. These repeaters have to satisfy very severe requirements:

- the amplification factor should have a predetermined variation as a function of frequency in a wide frequency range, for example, from 60 to 4,200 kc/s;
- the noise factor should have a minimum value;
- the non-linear distortion should be very small in a wide frequency range, for example, less than −120 dB in the frequency range from 60 to 4,200 kc/s;
- the input and output impedances have to be adapted as accurately as possible to the impedances of the connected networks formed, for example, by transmission cables, inter alia in order to avoid reflections.

These devices involve the practical difficulty that with a predetermined amplification factor and a noise factor the control-range of the amplification factor can be extended only at the expense of the efficiency of the transistor amplifier.

An object of this invention is to provide a device of the kind set forth in which, while the above-mentioned severe requirements are satisfied, the control-range of the amplification factor is considerably enlarged and, in addition, the efficiency of the transistor amplifier is slightly increased.

The device according to the invention is characterized in that the current coupling circuit includes between the series resistor in series with the output transformer and the emitter circuit of the input amplifying stage, a transformer which steps up the impedance of the series resistor towards the emitter circuit.

The invention and its advantages will now be described more fully with reference to the drawing.

The FIGURE shows a telephone circuit repeater according to the invention suitable for the amplification of carrier frequency telephone signals in a frequency range of, for example, 60 to 4,200 kc/s.

The repeater shown is formed by a transistor amplifier having a variable amplification factor, in which the carrier frequency telephone signals in the frequency range from 60 to 4,200 kc/s are applied through an input transformer 1 for amplification to the cascade circuit of an input amplifying stage 2, an intermediate amplifying stage 3 and a final amplifying stage 4, the amplified signals being derived from an output transformer 5 in the final amplifying stage 4.

In the embodiment shown the base bias voltage of the transistor in the input stage 2 is derived from the resistors 6 and 7 forming a voltage divider connected between the positive terminal 8 and the negative terminal 9 of a supply voltage source, while the carrier frequency telephone signals are applied through a separation capacitor 10 to the input stage 2. The amplified signals of the input stage 2 are derived from a collector resistor 11 and applied for further amplification to an intermediate stage 3, the transistor of which comprises a collector resistor 12 and an emitter resistor 13. The carrier frequency telephone signals appearing at the collector resistor 12 of the intermediate stage 3 are applied for power amplification to the final stage 4, which is coupled via the output transformer 5 in its emitter circuit with a load impedance 14, for example, formed by the characteristic impedance of the section of a transmission cable next to the repeater.

In order to satisfy the severe requirements of a repeater — i.e. a predetermined amplification in the frequency range from 60 to 4,200 kc/s, a low noise factor, a low non-linear distortion in the frequency range from 60 to 4,200 kc/s and an accurate matching of input and output impedances — the repeater is provided with a combined voltage and current negative feedback. The output circuit 15 of the final amplifying stage 4 is connected for this purpose to the emitter circuit 16 of the input amplifying stage 2 through a coupling network 17, in which for the negative voltage feedback the voltage across the output circuit 15 is applied through a voltage coupling circuit 18 and for the negative current feedback the voltage proportional to the current through the output circuit 15 across a series resistor 19 in series with the output transformer 5 is applied through a current coupling circuit 20 to the emitter circuit 16. In the embodiment shown the voltage coupling circuit 18 is formed by the resistor 21 between the emitters of the transistors in the final stage 4 and the input stage 2, whereas the current coupling circuit 20 is formed by the resistors 22 between the junction of the output transformer 5 and the series resistor 19 in the output circuit 15 and the emitter of the transistor in the input stage 2.

For varying the amplification factor of the repeater the emitter circuit 16 of the input stage 2 includes in series with a fixed resistor 23 a variable resistor 24, for example, formed by an incandescent lamp or a thermistor, which may be included in a Bode network (not shown) for adapting the frequency characteristic of the amplification factor in a predetermined frequency range to the attenuation characteristics of a transmission cable of given length.

The requirements set out above for a repeater determine the combined negative voltage and current feedback in practice to such an extent that no possibility is left to obtain a large control-range of the amplification factor by means of the adjustable resistor 24 without reducing the efficiency of the amplifying stage 4, which will be explained more fully hereinafter.

For this purpose it will be assumed that the resistor 21 has a value $R_1$, the resistor 22 a value $R_2$, the resistor 19 a value $R_3$, the emitter circuit 16 a resistance value $R_4$. The resistance value of the load impedance 14, measured from the negative feedback circuit, is designated by $R_5$.

In almost all practical cases the amplification factor A of the repeater is determined with a very satisfactory approximation solely by the combined negative voltage and current feedback. A simple calculation shows that the requirement of load matching leads to the relationship:

$$\frac{R_1+R_2}{R_2+R_3}\cdot R_3=R_5 \qquad (1)$$

while with load matching it applies to the amplification factor A that:

$$A=\frac{1}{2R_4}\cdot\left[R_1+R_4\cdot\frac{R_5}{R_3}\right] \qquad (2)$$

The influence of the combined negative voltage and current feedback on the variation of the amplification factor A by the adjustment of the resistance value $R_4$ of the emitter circuit 16 is found by rewriting the relation (2) in the form:

$$A=\frac{1}{2}\cdot R_1\cdot\left[\frac{1}{R_4}+\frac{1}{R_1\cdot R_3/R_5}\right] \qquad (3)$$

The control-range of the amplification factor A is restricted in accordance with the relation (3) by the fact that apparently parallel to the resistance value $R_4$ of the emitter circuit 16 to be adjusted a resistance value $R_p$ occurs which is given by:

$$R_p=R_1\cdot(R_3/R_5) \qquad (4)$$

which value $R_p$ represents the influence of the combined negative voltage and current feedback.

If it is desired to enlarge the control-range of the amplification factor A by the adjustment of the resistance value $R_4$, this implies that the resistance value $R_p$ has to be increased. An increase of the resistance value $R_p$ by an increase of the resistance value $R_1$, however, causes an undesirable increase of the predetermined amplification factor $A$ (see the equation (2)) and this undesirable increase would give rise to over-excitation of the repeater so that the said severe requirements of freedom of distortion would no longer be satisfied. An increase of the resistance value $R_p$ without an increase of the amplification factor $A$ is only possible when the resistance value $R_3$ of the series resistor 19 in series with the output transformer 5 is increased. However, this is obtained at the expense of the efficiency $q$ of the final amplifying stage 4, which is mainly determined by the portion of the output voltage of the transistor in the final stage 4 appearing across the series resistor 19 and by the portion of the output current of the transistor in the final stage 4 passing through the resistor 21. With a satisfactory approximation it applies to this efficiency $q$ that:

$$q=(R_5/R_5+R_3)\cdot(R_1/R_1+R_5) \qquad (5)$$

Consequently, an increase of the resistance value $R_3$ comes down to a decrease of the efficiency $q$.

From the foregoing it appears that the above-mentioned requirements for a repeater restrict the control-range of the amplification factor $A$ obtained by an adjustment of the resistance value $R_4$ of the emitter circuit 16.

In practice this control-range is further restricted by the fact that frequently a reciprocal variation of the amplification factor $A$ is required. It is found that the reciprocal control of the amplification factor $A$ cannot be obtained by varying as a whole the resistance value $R_4$ of the emitter circuit 16, this being only possible by splitting up the resistance value $R_4$ up to a constant portion $R_s$ of the fixed resistor 23 and a variable portion of the adjustable resistor 24, which has a nominal value $R_o$. In order to satisfy the requirement of a reciprocal variation, that is to say in order to have an amplification factor $A$ as a function of the adjusted resistance value $xR_o$ or $R_o/x$, when the resistance value $R_o$ is varied by a factor $x$, satisfying the relation:

$$A(xR_o)\cdot A(R_o/x)=[\,A(R_o)]^2 \qquad (6)$$

for all values of $x$, the resistance values $R_o$, $R_p$ and $R_s$ have to satisfy the relation:

$$R_o^2=(R_p+R_s)\cdot R_s \qquad (7)$$

It follows therefrom that by reciprocal variation of the amplification factor $A$ in series with the adjustable resistor 24 a fixed resistor 23 having a value $R_s$ given by the relation (7) has to be provided, which fixed resistor 23 brings about an additional restriction of the control-range of the amplification factor $A$ when the adjustable resistor 24 is varied. In the case of reciprocal variation this control-range is given by the relation:

$$\frac{A(R_o)}{A(xR_o)}=\frac{xR_o+R_s}{R_o+xR_s} \qquad (8)$$

In accordance with the invention the control-range of the amplification factor $A$ obtained by a variation of the adjustable resistor 24 is considerably enlarged, all aforesaid requirements of the repeater being satisfied, by including in the current coupling circuit 20 between the series resistor 19 in series with the output transformer 5 and the emitter circuit 16 of the input stage 2 a transformer 25, which steps up the impedance of the series resistor 19 towards the emitter circuit 16.

In the embodiment shown the transformer 25 is formed by an autotransformer, while the series resistor 19 is connected between one end and a tap and the resistor 22 is connected to the other end, the ratio between the number of turns across which the series resistor 19 is connected and the total number of turns of the autotransformer 25 being equal to $1:(1+n)$.

The operation of the transformer 25 is such that without adversely affecting the efficiency $q$ of the output stage 4 the contribution of the series resistor 19 to the resistance value $R_p$ apparently occurring in parallel with the emitter circuit 16 is increased and hence the control-range of the amplification factor $A$ obtained by a variation of the adjustable resistor 24 is enlarged.

The results of the provision of the transformer 25 in the current coupling circuit 20 of the combined negative voltage and current feedback will now be explained with reference to the embodiment shown. In this case the requirement of load matching involves the relation:

$$\frac{(1+n)\cdot R_1+R_2}{R_2+(1+n)\cdot 2R_3}\cdot R_3=R_5 \qquad (9)$$

whereas with load matching it applies to the amplification factor $A$ that:

$$A=\frac{1}{2R_4}\left[R_1+R_4\cdot\frac{R_5}{R_3}\cdot\frac{1+n\cdot R_3/R_5}{1+n}\right] \qquad (10)$$

from which it follows in the manner set out above that apparently in parallel with the resistance value $R_4$ of the emitter circuit 16 a resistance value $R_p$ occurs, which is given by $$R_p=R_1\cdot\frac{R_3}{R_5}\cdot\frac{1+n}{1+n\cdot R_3/R_5} \qquad (11)$$

To the efficiency $q$ of the output stage 4 also applies the relation (5).

A comparison between the Equations (4) and (11) shows that the transformer 25 increases the contribution of the series resistor 19 of the value $R_3$ to the resistance value $R_p$ by a factor which is given with an approximation for not too high values of $n$ by the number of turns $(1+n)$ of the transformer 25, since in practice the value $R_3$ is always considerably lower than the resistance value $R_5$. This increase of the resistance value $R_p$, as stated above, leads to an enlargement of the control-range of the amplification factor $A$, when the adjustable resistor 24 is varied, while the efficiency $q$ of the final stage 4 according to the Equation (5) remains the same.

This increase of the resistance value $R_p$ according to the Equation (10) also leads to a decrease of the amplification factor A. When by an increase of the resistance value $R_1$ the amplification factor $A$ is made equal to that obtained without the use of the transformer 25, both a further increase of the resistance value $R_p$ and hence a further enlargement of the control-range of the amplification factor $A$ and, as is shown by the Equation (5), an increase of the efficiency $q$ of the final stage 4 are obtained. The required load adaptation to the resistance value $R_5$ may always be obtained by suitably proportioning the resistance value $R_2$ (see the relation (9)).

With a reciprocal variation of the amplification factor $A$ this increase of the resistance value $R_p$ provides, in addition, the advantage of a reduction of the resistance value $R_s$ of the fixed resistor 23 in the emitter circuit 16 (see the Equation (7)), so that the already enlarged control-range of the amplification factor $A$ is further extended.

While the amplification factor and the noise factor of the repeater are maintained, the measures according to the invention provide a particularly effective enlargement of the control-range of the amplification factor, when controlled by the adjustable resistor 24, while at the same time the efficiency of the final amplifying stage 4 is enhanced. These two advantages, i.e. the enlargement of the control-range and the increase in efficiency are thus obtained in a structurally surprisingly simple manner so that the use in practice is very attractive.

With a practical embodiment of a repeater with reciprocal control of the amplification factor $A$, the control-factor $x$ of the adjustable resistor 24 having a maximum value of 2, the initial control-range of the amplification factor $A$ of 3.2 dB is extended to 4.7 dB by using the measures according to the invention, the number of turns $(1+n)$ of the transformer 25 being 3. By way of illustration of the repeater described a few data of the combined voltage and current negative feedback are given below:

| | |
|---|---|
| Resistor 21 ($R_1$) | 2140 Ω |
| Resistor 22 ($R_2$) | 513 Ω |
| Resistor 19 ($R_3$) | 20 Ω |
| Load impedance 14, measured from the feedback ($R_5$) | 200 Ω |
| Adjustable resistor 24, nominal value ($R_o$) | 62 Ω |
| Fixed resistor 23 ($R_s$) | 7.1 Ω |
| Number of turns of the transformer 25 $(1+n)$ | 3 |

The construction of the transformer 25 in the form of an autotransformer provides, particularly in amplifying wide frequency ranges, the practical advantage of minimum stray inductances which together with the capacitances between the turns, would otherwise produce undesirable resonance phenomena for the higher frequencies. If desired, the influence of the stray inductance may be completely suppressed by constructing the transformer 25 in the form of a transmission line transformer, in which case these inductances and capacitances are components of the characteristic impedance, which as such does not exhibit resonance phenomena. In order to obtain a satisfactory impedance matching of the transmission line transformer, it is preferred to arrange a portion of the resistor 22 in the connection between the tap of the transformer 25 and the junction of the series resistor 19 and the output transformer 5.

What is claimed is:

1. A device comprising a transistor amplifier having an input amplifying stage and an output amplifying stage including an output circuit provided with an output transformer, said transistor amplifier having a combined negative voltage and current feedback, in which the output circuit of the final amplifying stage is coupled with the emitter circuit of the input amplifying stage via a coupling network in which for the negative voltage feedback the voltage across the output circuit is applied via a voltage coupling circuit and for the negative current feedback the voltage proportional to the current through the output circuit across a series resistor in series with the output transformer is applied via a current coupling circuit to the emitter circuit, in which an adjustable resistor is included for controlling the amplification factor of the transistor amplifier characterized in that the current coupling circuit includes between the series resistor in series with the output transformer and the emitter circuit of the input amplifying stage, a transformer which steps up the impedance of the series resistor towards the emitter circuit.

2. A device as claimed in claim 1 characterized in that the transformer included in the current coupling circuit is formed by an autotransformer.

* * * * *

PO-1050
(5/69)

UNITED STATES PATENT OFFICE
CERTIFICATE OF CORRECTION

Patent No. 3,665,331 Dated May 23, 1972

Inventor(s) ROBARTUS PIETER WIARDA AND WILLEM VAN DORN

It is certified that error appears in the above-identified patent and that said Letters Patent are hereby corrected as shown below:

On the title page, Section [30] change "6715086"

to --6715068--.

In the Abstract, line 4, before "transistor" insert

--. This--.

Signed and sealed this 29th day of August 1972.

(SEAL)
Attest:

EDWARD M.FLETCHER,JR.
Attesting Officer

ROBERT GOTTSCHALK
Commissioner of Patents